(12) United States Patent
Wada

(10) Patent No.: US 6,458,707 B1
(45) Date of Patent: Oct. 1, 2002

(54) TOOL FOR SEMICONDUCTOR MANUFACTURING APPARATUS AND METHOD FOR USING THE SAME

(75) Inventor: Takashi Wada, Tokyo (JP)

(73) Assignee: NEC Corporation (JP)

( * ) Notice: Subject to any disclaimer, the term of this patent is extended or adjusted under 35 U.S.C. 154(b) by 46 days.

(21) Appl. No.: 09/615,130

(22) Filed: Jul. 13, 2000

(30) Foreign Application Priority Data

Jul. 16, 1999 (JP) .......................................... 11-203901

(51) Int. Cl.$^7$ ............................................. H01L 21/311
(52) U.S. Cl. ....................................... 438/694; 438/672
(58) Field of Search ................................. 438/276, 365, 438/387, 620, 672, 692, 694, 738, 778, 787, 788, 789

(56) References Cited

U.S. PATENT DOCUMENTS

| 5,234,854 A | * | 8/1993 | An et al. ..................... 438/672 |
| 5,651,820 A | * | 7/1997 | Ogasawara et al. ........... 118/66 |

FOREIGN PATENT DOCUMENTS

| JP | 56-006427 | 1/1981 | ......... H01L/21/205 |
| JP | 57-053930 | 3/1982 | ......... H01L/21/205 |
| JP | 357050437 A | * | 3/1982 | |
| JP | 357100731 A | * | 6/1982 | |
| JP | 357181123 A | * | 11/1982 | |
| JP | 63-123887 | 5/1988 | ........... C04B/41/91 |
| JP | 401215045 A | * | 8/1989 | |
| JP | 401291446 A | * | 11/1989 | |
| JP | 2-118076 | 5/1990 | ........... C23C/16/44 |
| JP | 403208345 A | * | 9/1991 | |
| JP | 6-151333 | 5/1994 | ......... H01L/21/205 |
| KR | 1991-0021346 | 12/1991 | ........... C03B/37/16 |

* cited by examiner

Primary Examiner—Hoai Ho
Assistant Examiner—Phuc T. Dang
(74) Attorney, Agent, or Firm—Hayes Soloway P.C.

(57) ABSTRACT

Before being used for a LPCVD device, a tool is washed first and on the surface of the tool a TEOS-NSG film, which is the film to be formed on a semiconductor substrate and whose etching speed is faster than that of a nitride film, is coated in advance. If the tool coated in the abovementioned manner is used to form a film on the semiconductor substrate, the nitride film formed on the substrate is also adhered to and deposited on the tool and if wet etching is applied to the tool, the TEOS-NSG film underlying the nitride film is exposed at the portions where the nitride film is thinner than at other portions. Since the etching time of the TEOS-NSG film is faster than that of the nitride film, the TEOS-NSG film is selectively etched. When the TEOS-NSG film is being removed, the nitride film left on the TEOS-NSG film is also peeled and removed at the same time. Thereby, reproduction can be achieved by etching without damage.

8 Claims, 2 Drawing Sheets

TOOL FOR SEMICONDUCTOR MANUFACTURING APPARATUS AND METHOD FOR USING THE SAME

BACKGROUND OF THE INVENTION

1. Technical Field of the Invention

The present invention relates to a tool for a semiconductor manufacturing apparatus and a method for using the same, more particularly, a tool for a semiconductor manufacturing apparatus, used for a chemical vapor deposition device and designed to prevent etching damage at the time of reproduction, and a method for using the same.

2. Description of the Related Art

Since a semiconductor substrate is given a prescribed treatment, heavy metal pollutant generally contaminate a tool that supports the substrate inside a treatment container, and so the tool needs to be cleaned before being used. A method of cleaning a tool made of silicon carbid (SiC) and used for a heat treatment process is cited as an example here. After the tool made of silicon carbide (hereinafter "SiC") is cleaned with hydrochloric acid and the pollutants are removed from the surface thereof, it goes through a 3-hour-long oxidization process at a temperature of 1270° C. to coat the surface of SiC with an oxidized film. Next, a 48-hour-long heat treatment in a nitrogen atmosphere is applied to the tool to form a silicon nitride film on the interface of the SiC surface and silicon oxidized film. Since a sufficiently dense silicon nitride film is formed on the SiC cleaned as explained above, the pollutants contained in the SiC will n disperse out of it and exert an adverse effect on the semiconductor substrate. (Japanese Laid-open Patent Publication No. 123887 of 1988)

Conventionally, with respect to a method for using a tool for device of the low pressure chemical vapor deposition, when a nitride film is formed on the semiconductor substrate by the LPCVD device, a nitride film and impurities in a chamber (hereinafter referred to as "nitride film and the like") also adhere to and deposit on the tool. After the deposited nitride film and the like on the tool reach a prescribed thickness of the accumulated films, wet etching is administered to the tool for the purpose of removing the nitride film and the like on the tool and reproducing and enabling the tool to be repeatedly used.

However, in the abovementioned method, if the thickness of the nitride film and the like adhered to and deposited on the tool varies from place to place, the remaining films such as the nitride films are easily generated where the films are thicker, even after etching is conducted. Therefore, to prevent such films from remaining, additional etching is generally carried out.

FIGS. 1A through 1C are schematic views of a tool used for the LPCVD device in the prior art. When the tool for the LPCVD device is used, the tool is first set in a tool-cleaning tank for initial cleaning. For the 30-minute-long initial cleaning mixed solution of HF, $HNO_3$ and $H_2O$ is used.

Next, when the tool 14 is used in order to support a semiconductor substrate on it, for example, and to deposit a nitride film 3 on the semiconductor substrate, the nitride film 3 is also adhered to and deposited on the tool 14, as shown in FIG. 1A. After the thickness of the accumulated nitride film 3 deposited on the tool 14 reaches a prescribed thickness, the tool 14 is detached from the device. Subsequently, the tool 14 on which the nitride film 3 is deposited, is detached from the LPCVD device, and etching is carried out by using a mixed solution of HF and $HNO_3$ to reproduce the tool 14.

As shown in FIG. 1B, if the thickness of the nitride film 3 deposited on the tool 14 is locally uneven, not all of the nitride film 3 can be removed by etching on the parts where the nitride film 3 is thick. Accordingly, a protruded part 3a of the nitride film remains on the surface of the tool 14 reproduced by etching. In order to remove such protruded part 3a of the nitride film remaining on the tool 14, additional etching is carried out and the tool 1 is reproduced.

However, by the additional etching applied to the abovementioned tool 14, the following problem arises. Specifically, on the parts where the nitride film 3 formed on the tool 14 is relatively thin, removal of the nitride film 3 has already been completed and the surface of the tool 14 is exposed. Therefore, additional etching results in over etching to the tool 1. The surface of the tool 1 is partially excessively etched, as shown in FIG. 1C, causing the tool 14 to be damaged and the life thereof is shortened.

SUMMARY OF THE INVENTION

It is an object of the present invention to provide a tool for a semiconductor manufacturing apparatus which is reproducible by etching without being damaged, and a method for using the same.

A tool of the semiconductor manufacturing apparatus according to the present invention is used for forming a film on the semiconductor substrate. The tool of the semiconductor manufacturing apparatus comprises a base portion, and a coating film coated on the surface of said base portion. Etching speed of the coating film is faster than that of a film to be formed on said semiconductor substrate.

A method for using the tool for the semiconductor manufacturing apparatus according to the present invention, comprises the steps of forming a coating film, the etching speed of the coating film being faster than that of a film to be formed on a semiconductor substrate, on the surface of a base portion, supporting the semiconductor substrate by said base portion and forming a film on said semiconductor substrate, and removing said coating film of the surface of said base portion and reproducing said base portion by giving wet etching to said base portion.

In the present invention, the film, whose etching speed is faster than that of the film to be formed on the semiconductor substrate, has already been coated on the surface of the tool. The film to be formed on the semiconductor substrate is called a production film. If this tool is used in the semiconductor manufacturing apparatus and a production film is formed on said semiconductor substrate, the production film is also adhered to the coating film formed on the surface of the tool. After the production film reaches a prescribed thickness, the tool is detached from the device and is reproduced by wet etching. In this procedure, first, on the parts where the production film, adhered to the coating film, is thinner than other parts, the coating film underlying the production film is exposed. Since the exposed coating film is etched faster than the production film it is selectively etched and removed. While the coating film is being removed, the production film, which is adhered to the coating film, is also peeled and removed, together with the coating film. Since no production film can remain on the tool, additional etching required in the prior art is no longer necessary and the problem of over etching of the tool can be resolved.

DETAIL DESCRIPTION OF THE PREFERRED EMBODIMENTS

Figure 1A:
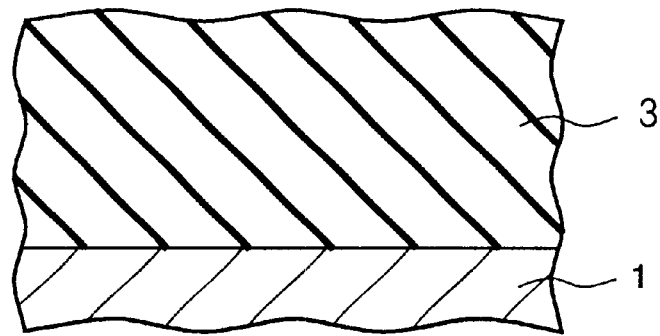
FIGS. 1A through 1C are schematic views of a tool used for the LPCVD device in the prior art.
Figure 1B:
Figure 1C:

A concrete explanation of a tool for a semiconductor manufacturing apparatus and a method for using the same, according to the embodiments of the present invention, is given below with reference to attached drawings. An example of the tool for the semiconductor manufacturing apparatus according to the embodiments of the present invention, for example, is a stage that is used for the LPCVD device and holds said substrate when a production film, a film to be formed on the semiconductor substrate, is formed.

The tool of the present invention comprises a base portion and a coating film coated on the surface of this base portion. The base portion has been used as a tool for the semiconductor manufacturing apparatus.

For the purpose of reproducing such a tool by etching, before the production film is formed on the semiconductor substrate for example, the base portion is given initial cleaning and then a film (a coating film), whose speed of reaction to an etching solution is faster than that of the production film formed on the semiconductor substrate when the tool is reproduced by etching, is coated on the substrate in advance.

Subsequently, if the tool is used for supporting the semiconductor substrate inside the LPCVD device to form the production film including the nitride film and the like, on the semiconductor substrate, the production film, whose etching speed is slower than that of the coating film coated on the surface of the tool, also adheres to and deposits on the tool.

Then, after the production film reaches a prescribed thickness, this tool is taken out of the device and soaked in a wet etching solution. Since the coating film has already been formed on the surface of this tool, the production film, deposited on the coating film and whose etching speed is slower than that of the coating film, is first removed and the underlying coating film is exposed, where the production film is thinner, if wet etching is applied to the tool. Subsequently, the coating film, whose etching speed is faster, is selectively removed, and the production film overlying the coating film is peeled. By this procedure, the production film is peeled and removed, together with the coating film whose etching speed is faster and no production film can remain on the base portion. Accordingly, additional etching that was required in the prior art is no longer necessary in order to remove the production film completely and the problem of over etching of the surface of the substrate of the tool can be resolved. By this method, the tool for the semiconductor manufacturing apparatus can be reproduced without being damaged.

A first embodiment of the present invention is explained in detail below. FIGS. 2A through 2D are schematic views illustrating a method for using the tool for the LPCVD device according to the embodiments of the present invention. The tool of the present embodiment is to be used for the LPCVD device, and one example of the tool is a stage used for holding the substrate when the production film is being formed on the semiconductor substrate. Illustrations of the LPCVD device and semiconductor substrate are omitted.

A tool 4 of the present embodiment comprises a base portion 1 and a TEOS-NSG film 2 coated on the surface of the base portion 1. When the tool 4 is used for the LPCVD device, the base portion 1 is first submerged in a cleaning tank for initial cleaning. The initial cleaning uses a solution mixed with HF, $HNO_3$ and $H_2O$ and lasts for 30 minutes. In addition, this base portion 1 was used as a tool in the LPCVD device in the prior art.

Figure 2A:
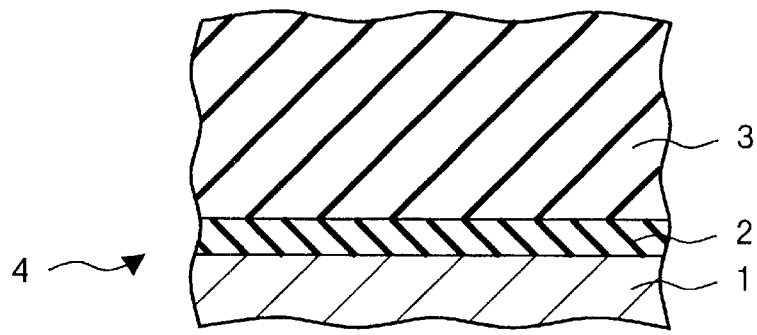
FIGS. 2A through 2D are schematic views illustrating a method for using the tool for the LPCVD device, according to embodiments of the present invention.

Next, the coating film, whose speed of reaction to the etching solution, used for etching reproduction of the tool 4, is faster than that of the production film, is formed on the substrate 1, as shown in FIG. 2A. The solution mixed with HF and $HNO_3$ can be used as the etching solution for etching reproduction. In the present embodiment, if the production film is supposed to be a nitride film, for example, a TEOS-NSG (Orthtetraethoxysilane ($Si(OC_2H_5)_4$)-nitride-silicate glass) film 2 can be used as the coating film, whose speed of reaction to the etching solution made of a mixture of HF and $HNO_3$ is faster than that of the production film.

First, the base portion 1 is set in a TEOS-NSG film deposition device and the TEOS-NSG film 2, whose etching speed is faster than that of the nitride film, coats the base portion 1 to be, for example, 5000 Å thick. If the etching solution used for etching reproduction is supposed to be a mixture of HF and $HNO_3$, the speed of the TEOS-NSG film 2 being etched by the etching solution is, for example, approximately 1000 Å/minute.

After the base portion 1 is completely coated with the TEOS-NSG film 2, the semiconductor substrate is held on the tool 4, for example, and on that semiconductor substrate the production film is formed by LPCVD. This production film, for example, is a nitride film in this embodiment.

In addition, when the production film is a nitride film, a poly-silicon film can be used as the coating film, whose etching speed is faster than that of the production film. In the case where a poly-silicon film is used as the coating film of the tool 4, the thickness of the poly-silicon film and time required for reproducing the tool by etching is the same as those of the TEOS-NSG film 2.

After having the tool 4 hold the semiconductor substrate, the tool 4 is put into a nitride film deposition hearth to form the nitride film 3 on said semiconductor substrate. As shown in FIG. 2A, when the nitride film 3 is formed on the semiconductor substrate as the production film, the nitride film 3 also adheres to the TEOS-NSG film 2 on the tool 4. After the thickness of the accumulated nitride film 3 reaches 60000 Å, the tool 4 is taken out of the LPCVD device. In this case, the surface of the nitride film 3 deposited on the TEOS-NSG film 2 on the tool 4 is usually uneven and bumpy, and some parts are thicker or thinner than other parts.

Next, wet etching is applied to the tool 4, with a mixture of HF and $HNO_3$. When the mixture of HF and $HNO_3$ is used as the etching solution, the etching speed of the nitride film 3 is, for example, approximately 400 Å/minute.

Figure 2B:
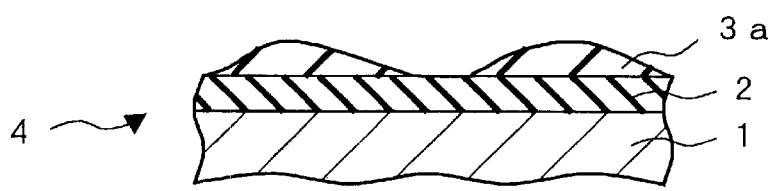

Since the upper layer, the nitride film 3, is not uniform in thickness, as shown in FIG. 2B, the dented parts where the nitride film 3 is thinner than other parts are thoroughly removed first, and the lower layer, the TEOS-NSG film 2, is exposed after the tool is soaked into the etching solution. In the protruded parts of the nitride film 3 which is thicker than other parts, the protruded parts 3a of the nitride film are left on the TEOS-NSG film 2.

Figure 2C:
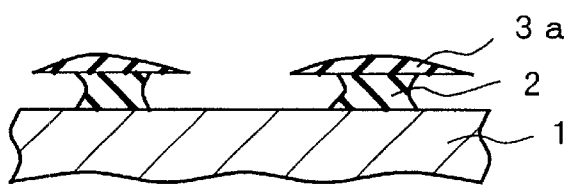

As explained above, if the etching of the tool 4 proceeds with the TEOS-NSG film 2 partially exposed, as shown in FIG. 2C, the etching speed of the TEOS-NSG film 2 is more than twice as fast as that of the nitride film 3 adhered to the TEOS-NSG film 2, and so, in the parts where the TEOS-NSG film 2 is exposed, the TEOS-NSG film 2 is etched before the nitride film 3.

Figure 2D:
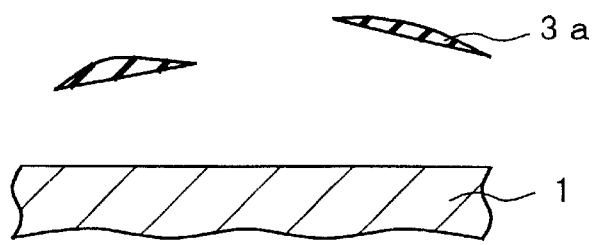

As shown in FIG. 2D, when etching proceeds further, the TEOS-NSG film 2 coated on the surface of the base portion 1 of the tool 4 is etched crosswise, the nitride film 3 left unremoved by etching on the TEOS-NSG film 2 from the base portion 1, is peeled from the base portion 1 and removed from the base portion 1, together with the TEOS-NSG film 2.

As explained above, by coating the base portion 1 with a film whose etching speed is faster than that of the nitride film 3 for production, the nitride film 3 for the production adhered to the base portion 1 never remains when the tool 4 goes through etching for its reproduction. Accordingly, since additional etching required in the prior art is no long necessary, the problem of over etching of the surface of the base portion 1 can be resolved and damages caused to the tool 4 (base portion 1) can be prevented.

Further, the base portion 1 whose etching is completed is washed in water for, for example, 80 minutes after the completion of the reproduction, and moved to a dryer and dried for, for example, 6 hours. Then, it is coated with the TEOS-NSG film 2 again and reused.

Next, a second embodiment of the present invention is explained. In the first embodiment a process of coating the base portion 1 with the TEOS-NSG film 2 and a process of forming the nitride film 3 for production on the semiconductor substrate through the use of this tool are carried out in separate LPCVD devices, but in this embodiment, the LPCVD device is constituted so that both of the TEOS-NSG film 2 and nitride film 3 may be formed in the same device. Thereby, the TEOS-NSG film 2 and the nitride film 3 can be formed in the same chamber of the same device in succession.

Since the tool of the LPCVD device is usually heated to a high temperature between 500°C. and 800° C., when the tool is detached from a device and attached to another in order to form the TEOS-NSG film 2 and nitride film 3 thereon as described in the first embodiment, the tool heated to the high temperature needs to be cooled down. Therefore, if the LPCVD device is constituted so that 2 kinds of the film may be formed in the same device, the tool does not need to be detached from the LPCVD device that forms the coating film on the base portion of the tool, and be attached to the LPCVD device that forms the production film on the semiconductor substrate, and therefore, the time required for cooling down the tool (approximately 6 hours) can be saved.

Also, extra handling that accompanies changing of the tool from one device to another is cut down, resulting in cutting down of the risks of handling damage to the tool.

As explained above in detail, according to the present invention, the film whose etching speed is faster than that of the film to be formed on the semiconductor substrate is coated on the surface of the tool and although the film formed on the semiconductor substrate adheres to the surface of the tool, too, by using this tool for a semiconductor manufacturing apparatus, the coating film can selectively be removed and adhered substances can be thoroughly removed when this tool is being reproduced by etching. Accordingly, additional etching required in the prior art is no longer necessary and the problem of over etching of the surface of the tool for a semiconductor manufacturing apparatus can be resolved and damage caused to the tool can be prevented when the tool for a semiconductor manufacturing apparatus is reproduced.

What is claimed is:

1. A tool for supporting a semiconductor substrate in a semiconductor manufacturing apparatus, used for forming a production film on said semiconductor substrate, which tool comprises:

a base portion, and a coating film coated on the surface of said base portion, said coating film having an etching speed faster than that of the production film to be formed on said semiconductor substrate.

2. A tool according to claim 1, wherein said production film is a nitride film and said coating film is a silicon nitride film.

3. A tool according to claim 1, wherein said production film is a nitride film and said coating film is a poly-silicon film.

4. A method for treating a tool for supporting a semiconductor substrate in a semiconductor manufacturing apparatus, used for forming a production film on said semiconductor substrate, comprising the steps of:

forming a coating film whose etching speed is faster than that of said production film on a surface of said tool;

supporting said semiconductor substrate on said coated surface on said tool, and forming a production film on said semiconductor substrate; and removing said coating film from the surface of said tool and reproducing said tool, by we etching to the surface of said tool.

5. A method according to claim 4, wherein said semiconductor manufacturing apparatus is a low pressure chemical vapor deposition device.

6. A method according to claim 4, wherein said production film is a nitride film and said coating film is a silicon nitride film.

7. A method according to claim 4, wherein said production film is a nitride film and said coating film is a poly-silicon film.

8. A method according to claim 4, wherein said production film and said coating film are formed in the same chemical vapor deposition device.

* * * * *

UNITED STATES PATENT AND TRADEMARK OFFICE
CERTIFICATE OF CORRECTION

PATENT NO.     : 6,458,707 B1
DATED          : October 1, 2002
INVENTOR(S)    : Wada, Takashi It is certified that error appears in the above-identified patent and that said Letters Patent is hereby corrected as shown below:

<u>Column 6,</u>
Line 38, "we" should be -- wet --.

Signed and Sealed this

Twenty-eighth Day of October, 2003

JAMES E. ROGAN
*Director of the United States Patent and Trademark Office*